(12) United States Patent
Gonzalez

(10) Patent No.: US 7,812,679 B2
(45) Date of Patent: Oct. 12, 2010

(54) MULTI-BAND FREQUENCY GENERATION METHOD AND APPARATUS

(75) Inventor: Armando J. Gonzalez, Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 12/165,604

(22) Filed: Jun. 30, 2008

(65) Prior Publication Data

US 2008/0290917 A1 Nov. 27, 2008

Related U.S. Application Data

(63) Continuation-in-part of application No. 11/288,796, filed on Nov. 29, 2005.

(51) Int. Cl.
*H03L 7/085* (2006.01)
*H03L 7/18* (2006.01)

(52) U.S. Cl. .............. 331/49; 331/2; 331/17; 331/48; 331/56; 331/179; 327/157

(58) Field of Classification Search ............ 331/2, 331/46, 48, 49, 56, 17, 179; 327/148, 157
See application file for complete search history.

(56) References Cited

U.S. PATENT DOCUMENTS

| 5,686,864 | A | * | 11/1997 | Martin et al. | ............... | 331/1 A |
| 6,714,765 | B1 | * | 3/2004 | Kimppa | ................. | 455/76 |
| 6,785,525 | B2 | * | 8/2004 | Ries | ................... | 455/258 |
| 6,838,947 | B2 | * | 1/2005 | Gomez | ................. | 331/17 |
| 7,023,283 | B2 | * | 4/2006 | Kawasumi et al. | ............. | 331/2 |

* cited by examiner

*Primary Examiner*—Robert Pascal
*Assistant Examiner*—Levi Gannon
(74) *Attorney, Agent, or Firm*—Barbara R. Doutre

(57) ABSTRACT

A frequency generation unit (FGU) 100 includes a plurality of selectable voltage controlled oscillators (110) whose output frequencies are chosen in relationship with a predetermined intermediate frequency (IF) and frequency divider value (M) to provide multi-band frequency generation capability in a single communication device. A programmable reference divider (104), phase detector (174) and programmable charge pump (106) take an incoming reference frequency (120) and generate a charge pump output (124) to optimize the in-band phase noise in the FGU 100. A fixed loop filter (108) filters the charge pump output (124) to generate a control voltage (126) for the selectable VCOs (110). The desired frequency band is selected and enabled using control logic (128).

24 Claims, 2 Drawing Sheets

MULTI-BAND FREQUENCY GENERATION METHOD AND APPARATUS

CROSS-REFERENCE TO RELATED APPLICATIONS

This application is a continuation-in-part of application entitled "MULTI-BAND FREQUENCY GENERATION METHOD AND APPARATUS," U.S. patent application Ser. No. 11/288,796, filed on Nov. 29, 2005.

TECHNICAL FIELD

This invention relates in general to communication systems and more particularly to the multi-band frequency generation is such systems.

BACKGROUND

The demand for multi-band communication systems has increased tremendously, particularly in the public safety arena where the interoperability of different communication systems is highly desirable. Fire departments, medical rescue and law enforcement are just a few examples of agencies that can benefit from the ability to communicate across different systems. The ability of a communication device, such as a radio, cell phone, digital assistant or the like, to operate amongst different frequency bands facilitates seamless mobility for the user.

The design of a multi-band communication device is complex as the different operating specifications for each band need to be addressed. In order to provide multi-band operation, circuit designers have typically increased the number of voltage controlled oscillators and provided multiple loop filters. Variations in frequency, tuning sensitivity, acquisition lock time and loop filter bandwidth are examples of operating parameters that need to be addressed in these circuits. Reduction of parts count and utilization of circuit board space are also of paramount importance in a portable multi-band radio design as these affect the cost, size and weight of each device.

Accordingly, a multi-band approach facilitating the issues discussed above is desirable.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

Figure 1:
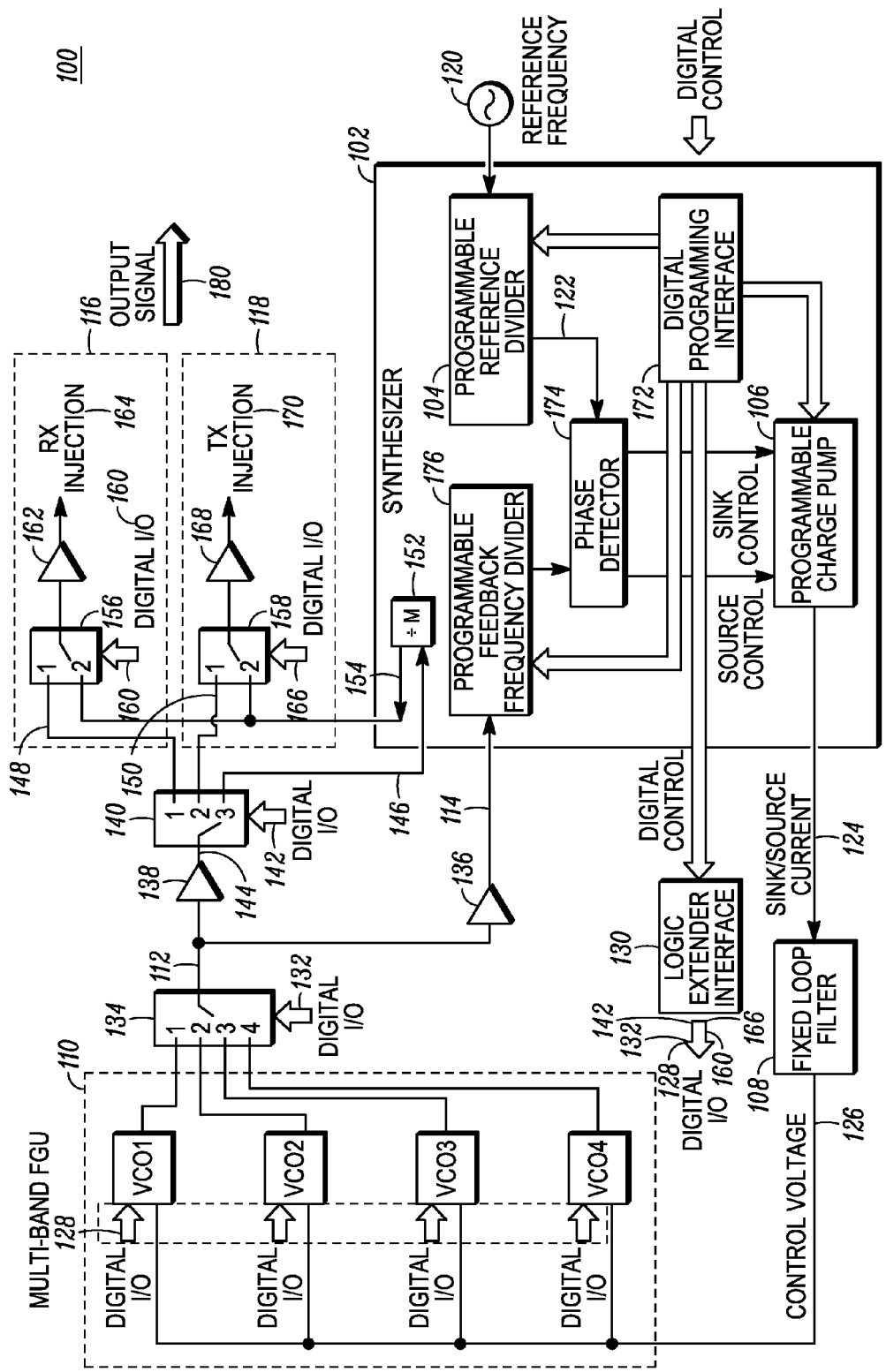
FIG. 1 is a block diagram for a multi-band frequency generation circuit formed in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

The present invention may be embodied in several forms and manners. The description provided below and the drawings show exemplary embodiments of the invention. Those of skill in the art will appreciate that the invention may be embodied in other forms and manners not shown below. The invention shall have the full scope of the claims and shall not be limited by the embodiments shown below. It is further understood that the use of relational terms, if any, such as first, second, top and bottom, front and rear and the like are used solely for distinguishing one entity or action from another, without necessarily requiring or implying any such actual relationship or order between such entities or actions.

Generally, a Frequency Generation Unit (FGU) comprises a plurality of Voltage Controlled Oscillators (VCOs) to satisfy all multi-band requirements in a single communication device. The selection of an appropriate intermediate frequency (IF) and VCO output frequency divider (M) allows for a minimum number of VCOs to selectively cover multiple spectrum ranges having narrow channel spacing. Further, a programmable reference divider and a programmable charge pump are used to maintain a constant loop bandwidth within the Frequency Generation Unit (FGU). Typically, a phase detector receives signals from a loop divider (also called feedback frequency divider) operating at a loop divider value (N) and a programmable reference divider and outputs control signals to the programmable charge pump.

The phase detector and charge pump circuits in a frequency synthesizer generate noise inside the bandwidth of the loop filter. This noise is commonly called in-band noise. The in-band noise is directly proportional to the loop divider value (N) and is inversely proportional to the charge pump output current. The in-band noise combined with the VCO phase noise is generally referred to as total phase noise. Typically, a receiver comprising the FGU receives a signal which includes multiple channels. In general, the ability of the receiver to suppress interference between adjacent channels depends on the total phase noise generated by the FGU of the receiver. Typically, if the adjacent channels are closely spaced in the frequency spectrum the phase noise performance of the FGU in the receiver should be good to enable the receiver in suppressing the interference between adjacent channels. In public safety devices such as Association of Public-safety Communications Officials project 25 (APCO25) radios, the adjacent channels are spaced at +/−12.5 KHz. In general, the adjacent channels in public safety devices which are operating in a private communication network (private network) have narrow channel spacing. The narrow channel spacing in general refers to the scenario where the adjacent channels are spaced less than (or equal to) 25 KHz apart. Therefore, there is a need to provide a FGU in a receiver which optimizes phase noise performance of the receiver.

In accordance with embodiments of the present invention, there is provided herein a FGU having programming control to provide optimum level of performance. The FGU includes a minimum number of low phase noise VCOs to satisfy all multi-band requirements in a single communication device. The phase noise in the FGU is optimized by providing programming control on the reference frequency, the feedback frequency to the phase detector and the charge pump output current. In general, the in-band noise generated by the phase detector and the charge pump circuits depends on the loop divider (N). In this document the terms 'loop divider,' 'feedback frequency divider,' and 'feedback divider,' are used interchangeably. The relationship between the in-band noise and the loop divider value (N) is defined by $$n = 20 \log N \qquad (1)$$

where:

n is the in-band phase noise component in the total phase noise; and

N is loop divider value.

In accordance with one embodiment, the in-band phase noise in the FGU is optimized by programmably controlling the value of the loop divider (N). Further, the total phase noise in the FGU is optimized by providing low phase noise VCOs.

Since the in-band phase noise in an FGU is directly proportional to the loop divider (N), the loop divider value (N) is minimized by providing programming control in the FGU. Also, the loop divider value (N) is the ratio of the frequency of the selected VCO and the reference frequency i.e. N=Fvco/Fref. Therefore, to reduce the loop divider value (N), the value of reference frequency (Fref) is maximized. However, the reference frequency value depends on the maximum frequency on which the phase detector can operate. Typically, the maximum operation frequency of a phase detector depends on the IC technology employed and, due to new semiconductor technologies, has been increasing. However, a person of ordinary skill in the art will appreciate that the value of the loop divider (N) cannot be reduced beyond certain limits. If the loop divider value (N) is allowed to decrease without bounds, the phase excursions during frequency acquisition increase and the operation of the phase detector actually becomes noisier to the point of not permitting the synthesizer to lock. Further, the bandwidth of a closed phase locked loop can be expressed in terms of the natural frequency of the loop. The natural frequency (Fμ) of a phase locked loop is a function of KoKφ/N where Ko is the VCO gain, Kφ=Icp/π or =Icp/2π, depending on the design of the phase detector, is the phase detector gain and N is the loop division. If the reference frequency changes, N will change (N=Fvco/Fref). Therefore in order to keep the loop filter constant when Fref changes an accompanying change in phase detector gain must take place. This is accomplished by changing the charge pump current (Icp). Icp must also change if there are variations in Ko in order to keep the loop filter bandwidth constant. Thus, the loop divider value (N) is kept within optimum operating bounds by providing programmable control to the feedback frequency divider, reference divider and the charge pump.

By providing programming control in the FGU of a receiver the total phase noise can be reduced. Further, a lower value of total phase noise eases the attenuation requirements of the loop filter, allowing for a wider loop filter bandwidth which decreases the frequency acquisition time. A radio transceiver for a communication network where adjacent channels are closely spaced in the frequency spectrum can successfully decode the channels if the noise performance of the FGU in the transceiver is good. For example, a public safety communication device such as an APCO25 radio operating in a private communication network typically has adjacent channels spaced +/−12.5 KHz in the frequency spectrum. Thus, an APCO25 receiver has to provide a 60 dB adjacent channel protection to enable successful reception and selection of a desired channel. However, by using a receiver including a FGU having programmable control to optimize the phase noise in the output signal, the desired adjacent channel protection can be achieved.

FIG. 1 shows a block diagram of a frequency generation unit (FGU) 100 formed as part of a communication device in accordance with the present invention. FGU 100 comprises a synthesizer 102 having a programmable reference divider 104 and programmable charge pump 106, a fixed loop filter 108, and a plurality of selectable VCOs 110. Generally, the VCOs 110 are low phase noise VCOs. A selected VCO frequency 112 is fed back to synthesizer 102 along feedback path 114 to programmable feedback frequency divider 176 and phase detector 174 thereby closing the synthesizer loop. The selected VCO frequency 112, with appropriate amplification, can be used for receiver injection via receive (RX) path 116 or for transmit injection via transmit (TX) path 118.

In accordance with one embodiment, appropriate dividing values for the programmable feedback frequency divider 176 and the programmable reference divider 104 are selected to optimize phase noise in the FGU. Also, the charge pump current of the programmable charge pump 106 is controlled to compensate for the changes in the loop divider value (N) and to maintain proper loop filter bandwidth which provides the required attenuation to achieve desired phase noise performance. Further, the VCO frequency bands are chosen and set in conjunction with an appropriate intermediate frequency (IF) and divide-by-M (÷M) VCO output divider 152 such that a minimum number of VCOs can be used to satisfy all desired bands. As an example, for a selected IF of 109.65 MHz and a ÷M of two, all VHF, UHF, 700 MHz and 800 MHz bands can be covered with four VCO modules. For example, from the plurality of VCOs 110, VCO1 can be set for the 700/800 MHz RX bands, VCO2 can be set for the 300/500 MHz and 400/600 MHz UHF TX bands; VCO3 can be set for 200/400 MHz VHF TX band and the 300/599 MHz UHF RX band; and VCO4 can be set for the 200/300 MHz VHF RX band and the 700/800 MHz TX band. Other band combinations can be used based on the selected IF and desired bands of operation. However, this may entail using additional VCO modules. By selecting an appropriate intermediate frequency (IF) and divide-by-M, a minimum number of VCOs can be used to satisfy the desired bands.

Digital programming interface 172 under microprocessor control provides programming capability to the programmable reference divider 104, programmable charge pump 106, programmable feedback frequency divider 176 and a switching logic extender interface 130. Interface 130 generates digital I/Os 128 for selecting the desired VCO and also generates other digital I/Os 132, 142, 160, and 166 for controlling a variety of switching circuitry 134, 140, 156, and 158 used throughout the FGU 100.

In operation, the programmable reference divider 104 receives and divides a reference frequency 120 to provide a divided reference frequency 122 to the phase detector 174 which provides sink/source controls to the programmable charge pump 106. The programmable reference divider 104, the programmable feedback frequency divider 176, and the programmable charge pump 106 receive control signals from digital programming interface 172 to optimize the in-band phase noise. The programmable charge pump 106 generates a charge pump output 124 which can sink or source current as appropriate. The charge pump output 124 is filtered through a loop filter 108 formed of fixed loop elements (capacitors, resistors, etc.) to produce a control voltage 126. The charge pump output 124 is controlled to maintain a maximum allowable loop filter bandwidth by changing the charge pump current and the reference frequency via programming. The control voltage 126 is used to steer a selected VCO from the plurality of VCOs 110. Control I/O 128 is used to select the desired VCO and desired VCO band of operation within that VCO. For example, digital I/O 128 may consist of a series of logic levels to enable the desired VCO and enable the desired band of operation within the enabled VCO. Each VCO may provide one or more bands of operation as discussed above.

Digital input 132 also controls RF switch 134 for routing the output of the selected VCO back to synthesizer 102 along feedback path 114 with amplification of selected VCO output signal 112 occurring at amplifier 136. The selected VCO output signal 112 is also amplified at amplifier 138 prior to being injected into either the receive path 116 or the transmit path 118.

Another RF switch 140 under logic control 142 takes amplified signal 144 and routes it to one of three routing paths 146, 148, 150. Routing path 146 divides the signal through the divide-by-M frequency divider 152, preferably integrated within synthesizer 102, to produce divided VCO output signal 154. Divided output signal 154 is forwarded to two routing switches, RX routing switch 156 in the RX path 116 and TX routing switch 158 in the TX path 118. RX routing switch 156 utilizes logic control 160 to route either the undivided VCO output signal from routing path 148 or the divided VCO output signal 154 to amplifier 162 to be used as a RX injection signal 164. TX routing switch 158 utilizes logic control 166 to route either the undivided output VCO signal from path 150 or the divided VCO output signal 154 to amplifier 168 to be used as a TX injection signal 170. As shown in FIG. 1, the FGU 100 generates an output signal 180 which comprises the RX injection signal 164 and/or the TX injections signal 170. The divide-by-M 152 and selection of intermediate frequency (IF) minimizes the number of VCOs required for the FGU 100.

Figure 2:
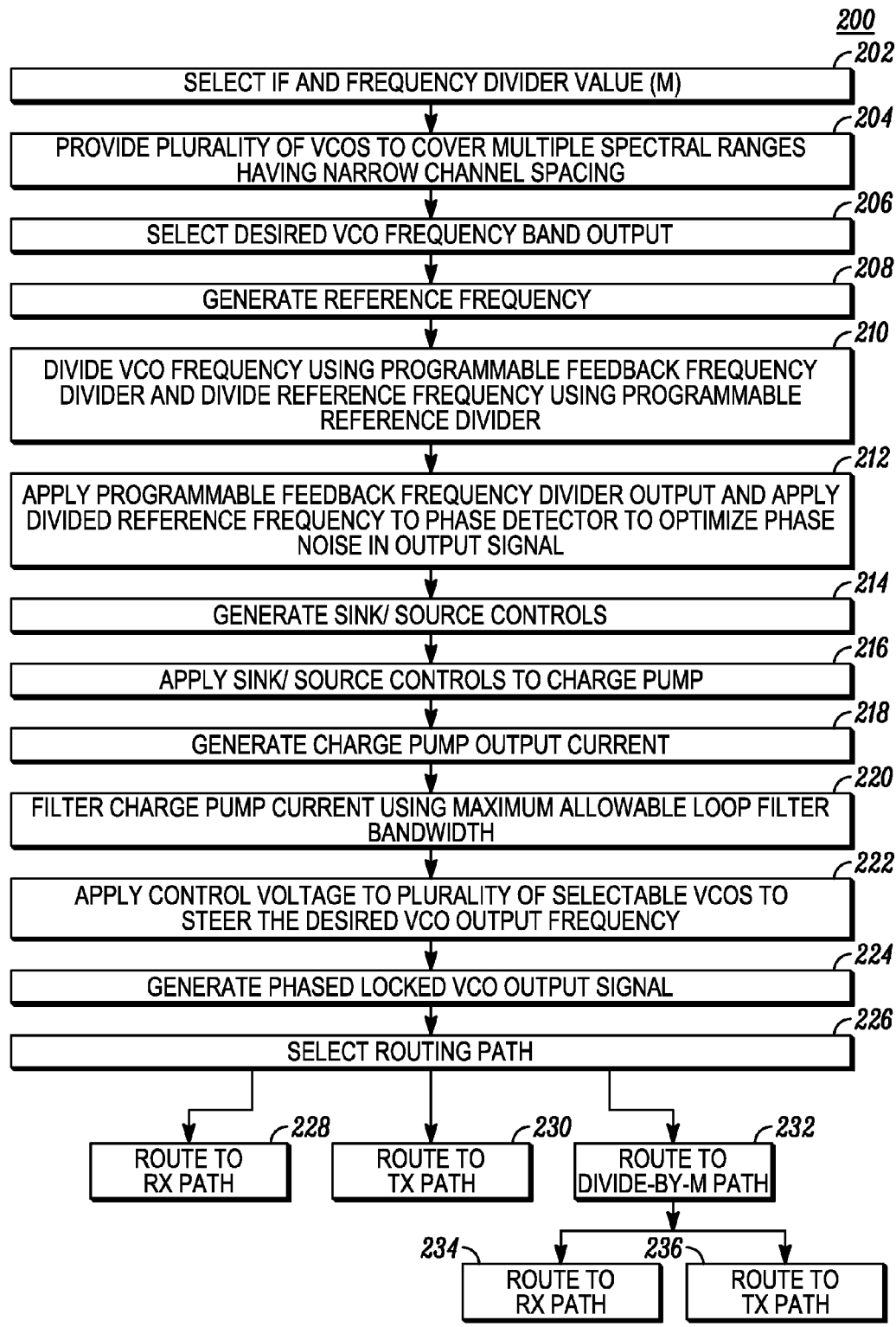
FIG. 2 is a method for generating an output frequency in accordance with the present invention.

FIG. 2 is a flowchart summarizing the technique of providing multi-band frequency generation in accordance with the present invention. Technique 200 begins at step 202 by selecting an intermediate frequency (IF) and a frequency divider value (divide-by-M value). A plurality of selectable VCOs covering multiple spectral ranges having narrow channel spacing is provided at step 204. A VCO frequency band output (via control logic) is selected from the plurality of selectable VCOs at step 206. A reference frequency is generated at step 208. The reference frequency is divided with a programmable reference divider at step 210. Also at step 210, a divided VCO feedback frequency is provided by a programmable feedback frequency divider. The value of the programmable reference divider and the value of the programmable feedback frequency divider are selected to optimize the in-band phase noise. The divided frequency feedback and the divided reference frequency are applied to a phase detector at step 212 to generate sink and source controls at step 214 which are applied to a programmable charge pump at step 216. The programmable charge pump generates a charge pump output current (sink/source) at step 218. The charge pump output current is filtered at step 220 via a loop filter using maximum allowable loop filter bandwidth. The loop filter is formed of fixed elements thereby producing a control voltage. The control voltage is applied to the plurality of selectable VCOs at step 222 which in turn frequency steers the selected VCO, thereby generating a phase locked VCO output signal at step 224.

Depending on the VCO frequency band selected at step 206, the VCO output signal generated at step 224 is selectively routed at step 226 through either a RX path at step 228, or a TX path at step 230 or is divided by the divide-by-M value at step 232. If routed through the divide-by-M path, then the divide-by-M frequency is then routed to the RX path at step 234 or the TX path at step 236. Signal amplification takes place along the various routing paths as appropriate.

By selecting the appropriate intermediate frequency (IF) in conjunction with selecting an output frequency divider M, a minimum number of VCOs are used to satisfy any communication band frequency spectrum bands in a single communication device. Utilizing a programmable charge pump, programmable feedback frequency divider and a programmable reference divider compensates for variations in VCO operating bandwidth and tuning sensitivity by optimizing the phase noise. The frequency generation unit formed in accordance with the present invention thus allows for a minimum number of VCOs to achieve multi-band operation even in scenarios where the adjacent channels have narrow channel spacing. This approach reduces parts count, cost and minimizes printed circuit board real estate thus providing significant advantages to a portable multi-band communication device.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

I claim:

1. A method of generating an output signal in a Multi-band frequency Generation Unit, the method comprising the steps of:
   operating the Multi-band frequency Generation Unit within an Association of Public-safety Communications Officials project 25 (APCO25) radio,
   selecting an intermediate frequency (IF) and a frequency divider value (M);
   providing a plurality of selectable VCOs based on the selected IF and the frequency divider value (M) to cover multiple spectrum ranges having narrow channel spacing, the plurality of selectable VCOs having VCO phase noise meeting the APCO25 radio requirements;
   selecting a VCO frequency band output from the plurality of selectable VCOs;
   generating a reference frequency;
   dividing a VCO output frequency using a programmable feedback frequency divider operating at a loop divider value (N) to generate a divided VCO feedback frequency and dividing the reference frequency using a programmable reference divider to generate a divided reference frequency;
   applying the divided reference frequency and the divided VCO feedback frequency to a phase detector to optimize phase noise in the output signal;
   generating sink/source control output signals at the phase detector;
   applying the sink/source control output signals to a programmable charge pump;
   generating a charge pump output current, wherein the charge pump output current is selected in conjunction with the divided reference frequency and the loop divider value (N) to optimize phase noise in the output signal;
   filtering the charge pump output current using a loop filter having the maximum allowable loop filter bandwidth based on fixed elements to produce a control voltage;
   applying the control voltage to the plurality of selectable VCOs thereby steering selected desired VCO frequency band output to generate a phase locked VCO output signal; and
   generating an output signal based on the phase locked VCO output signal.

2. The method of claim 1, wherein the step of generating the output signal further comprises:
   dividing the phase locked VCO output signal from the selected VCO by the frequency divider value (M) to generate a divided VCO output signal; and
   selecting one of the phase locked VCO output signal or the divided VCO output signal to generate the output signal, wherein the output signal is within VHF, UHF, 700 MHz and 800 MHz bands.

3. The method of claim 2, further comprising the steps of:
   routing the divided VCO output signal to one of: a transmit path and a receive path.

4. The method of claim 1, wherein narrow channel spacing comprises adjacent channels spaced equal to or less than 25 KHz apart.

5. The method of claim 1, further comprising the steps of:
   amplifying the phase locked VCO output signal; and
   routing the amplified phase locked VCO output signal to one of: a transmit path and a receive path.

6. The method of claim 1, wherein the phase noise in the output signal is directly proportional to $$n = 20 \log N$$

where:
$N = [F_{vco}/F_{ref}]$
$F_{vco}$ is frequency of the selected VCO,
$F_{ref}$ is reference frequency.

7. The method of claim 1, wherein the output signal falls within a frequency range used by public safety communication devices operating in a private communication network.

8. The method of claim 1, wherein providing a plurality of selectable VCOs further comprises:
   providing a minimum number of a plurality of selectable VCOs; and wherein dividing the VCO output frequency further comprises:
the loop divider value (N) is minimized and kept within optimum minimum operating bounds by the programmable feedback frequency divider, programmable reference divider and the programmable charge pump.

9. A multi-band frequency generation unit for a public safety communication device operating in a private network, comprising:
a synthesizer, operating within an Association of Public-safety Communications Officials project 25 (APCO25) radio, comprising:
a programmable reference divider for dividing a reference frequency to generate a divided reference frequency,
a programmable charge pump generating a charge pump output,
a programmable feedback frequency divider operating at a loop divider value (N), wherein the loop divider value (N) and the divided reference frequency, in conjunction with the charge pump output, are selected to optimize phase noise in the output signal, and
a phase detector receiving signals from the programmable feedback frequency divider and the programmable reference divider;
a loop filter having a maximum allowable loop filter bandwidth based on fixed elements and the charge pump output, the loop filter filtering the charge pump output and generating a loop filter control voltage output;
a plurality of selectable voltage controlled oscillators (VCOs) each having output frequencies set in relationship with a predetermined intermediate frequency and a frequency divider value (M) to cover multiple spectrum ranges having narrow channel spacing, the plurality of selectable VCOs receiving the loop filter control voltage output, the plurality of selectable VCOs having VCO phase noise meeting the APCO25 radio requirements;
a VCO output frequency divider operating at the frequency divider value (M) which receives a selected VCO output signal to generate a divided VCO output signal.

10. The multi-band frequency generation unit of claim 8, further comprising a plurality of radio frequency (RF) switches to select from the selected VCO output signal and the divided VCO output signal to provide multi-band frequency generation covering VHF, UHF, 700 MHz and 800 MHz bands in response thereto.

11. The multi-band frequency generation unit of claim 9, further comprising: switching logic for selecting a VCO from the plurality of selectable VCOs.

12. The multi-band frequency generation unit of claim 9, wherein output of the plurality of RF switches is fed to one of: a transmit (TX) injection path and a receive (RX) injection path.

13. The multi-band frequency generation unit of claim 9, wherein the narrow channel spacing comprises adjacent channels in the multiple spectrum ranges that are spaced at or less than 25 KHz apart.

14. The multi-band frequency generation unit of claim 9, wherein the public safety communication device is a radio transceiver which operates in accordance with Association of Public-safety Communications Officials project 25 (APCO-25) standards.

15. The multi-band frequency generation unit of claim 9, wherein the phase noise in the output signal is $$n = 20 \log N$$

where:
$N = [F_{vco}/F_{ref}]$
$F_{vco}$ is frequency of the selected VCO,
$F_{ref}$ is reference frequency.

16. The multi-band frequency generation unit of claim 9, wherein:
the plurality of VCOs comprises a minimum number of a plurality of selectable VCOs; and
wherein the loop divider (N) is minimized and kept within optimum minimum operating bounds by the programmable charge pump, the programmable reference divider and the programmable feedback frequency divider.

17. An Association of Public-safety Communications Officials project 25 (APCO25) radio, including:
a frequency generation unit (FGU), operating within the APCO25 radio, including:
a programmable charge pump generating a charge pump output wherein the charge pump output is selected in conjunction with a divided VCO frequency and a divided reference frequency to optimize phase noise in an output signal;
a programmable feedback frequency divider operating at a loop divider value (N), wherein the loop divider value (N) is selected in conjunction with the divided reference frequency to optimize phase noise in the output signal;
a loop filter having predetermined bandwidth based on fixed elements;
a plurality of selectable voltage controlled oscillators whose output frequencies are chosen in relationship with a predetermined intermediate frequency (IF) and a frequency divider value (M) to cover multiple spectrum ranges having narrow channel spacing, the plurality of selectable VCOs having VCO phase noise meeting the APCO25 radio requirements;
a VCO output frequency divider operating at the frequency divider value (M) which receives a selected VCO output signal to generate a divided VCO output signal; and
a plurality of radio frequency (RF) switches to select from the selected VCO output signal and the divided VCO output signal to provide multi-band frequency generation covering VHF, UHF, 700 MHz and 800 MHz bands in response thereto.

18. The APCO25 radio of claim 17, wherein the FGU includes:
a programmable reference divider for generating the divided reference frequency.

19. The APCO25 radio of claim 17, further comprising control logic to select a frequency band from the plurality of selectable VCOs to cover multiple spectrum ranges having narrow channel spacing.

20. The APCO25 radio of claim 17, wherein the selected VCO output signal is selected for use in one of: a transmit path and a receive path.

21. The APCO25 radio of claim 17, wherein the divided VCO output signal is selected for use in the one of: a transmit path and a receive path.

22. The APCO25 radio of claim 17, wherein:
the plurality of VCOs comprises a minimum number of a plurality of selectable VCOs; and
wherein the loop divider (N) is minimized and kept within optimum operating bounds by the programmable charge pump, the divided reference frequency and the programmable feedback frequency divider.

23. A public safety communication device operating in a private network, the public safety communication device comprising:

a multi-band frequency generation unit including a plurality of selectable VCOs controlled by a control voltage generated by a loop filter under maximum loop filter bandwidth conditions and a loop divider that, in conjunction with a divided reference frequency and a selected charge pump output, optimizes phase noise of a selected VCO output signal, wherein the plurality of selectable VCOs have VCO phase noise meeting an Association of Public-safety Communications Officials project 25 (APCO25) radio requirements.

24. The public safety communication device of claim 23, wherein:

the plurality of selectable VCOs comprises a minimum number of a plurality of selectable VCOs; and wherein the loop divider has a loop divider value (N) which is minimized and kept within optimum operating bounds by the divided reference frequency and the charge pump output.

* * * * *

UNITED STATES PATENT AND TRADEMARK OFFICE
CERTIFICATE OF CORRECTION

PATENT NO. : 7,812,679 B2　　　　　　　　　　　　　　　　　　　　　　　　Page 1 of 1
APPLICATION NO. : 12/165604
DATED : October 12, 2010
INVENTOR(S) : Gonzalez It is certified that error appears in the above-identified patent and that said Letters Patent is hereby corrected as shown below:

IN THE SPECIFICATION

Column 2, Line 6, delete "EMBODIMENT" and insert -- EMBODIMENTS --, therefor.

Column 2, Line 12, delete "drawing figures," and insert -- drawings, --, therefor.

Column 8, Line 59, in Claim 6, delete "Fvcois" and insert -- Fvco is --, therefor.

Column 9, Line 42, in Claim 10, delete "claim 8," and insert -- claim 9, --, therefor.

Column 9, Lines 62-63, in Claim 14, delete "(APCO-25)" and insert -- (APCO25) --, therefor.

Column 10, Line 3, in Claim 15, delete "Fvcois" and insert -- Fvco is --, therefor.

Signed and Sealed this
Twenty-fifth Day of October, 2011

David J. Kappos
*Director of the United States Patent and Trademark Office*